United States Patent
Cho et al.

(10) Patent No.: US 9,362,513 B2
(45) Date of Patent: Jun. 7, 2016

(54) ORGANIC THIN FILM TRANSISTOR SUBSTRATE AND METHOD OF MANUFACTURING THE SAME

(75) Inventors: Seung Hwan Cho, Hwaseong-si (KR); Bo Sung Kim, Seoul (KR); Keun Kyu Song, Gyeonggi-do (KR); Tae Young Choi, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 847 days.

(21) Appl. No.: 11/782,980

(22) Filed: Jul. 25, 2007

(65) Prior Publication Data

US 2008/0023695 A1 Jan. 31, 2008

(30) Foreign Application Priority Data

Jul. 28, 2006 (KR) .................. 10-2006-0071235

(51) Int. Cl.
  *G02B 5/08* (2006.01)
  *H01L 51/05* (2006.01)
  *H01L 27/32* (2006.01)
(52) U.S. Cl.
  CPC ........ H01L 51/0545 (2013.01); H01L 27/3246 (2013.01); *H01L 51/052* (2013.01)
(58) Field of Classification Search
  CPC .............. H01L 27/3246; H01L 51/052; H01L 51/0545
  USPC ..................... 257/40, 42, 43, 72, 347; 438/99
  See application file for complete search history.

(56) References Cited

U.S. PATENT DOCUMENTS

| 5,355,235 | A | * | 10/1994 | Nishizawa et al. | 349/43 |
| 5,539,219 | A | * | 7/1996 | den Boer et al. | 257/72 |
| 5,805,252 | A | * | 9/1998 | Shimada et al. | 349/113 |
| 5,871,872 | A | * | 2/1999 | Matijevic et al. | 430/7 |
| 6,025,605 | A | * | 2/2000 | Lyu | 257/59 |
| 6,300,988 | B1 | * | 10/2001 | Ishihara et al. | 349/43 |
| 6,872,980 | B2 | * | 3/2005 | Cheng et al. | 257/72 |
| 6,874,898 | B2 | * | 4/2005 | Akiyama | H01L 51/0013 257/382 |
| 6,912,024 | B2 | * | 6/2005 | Kim | G02F 1/1362 349/106 |
| 7,253,848 | B2 | * | 8/2007 | Wong et al. | 349/43 |
| 7,456,912 | B2 | * | 11/2008 | Wong et al. | 349/43 |
| 7,554,113 | B2 | * | 6/2009 | Arai et al. | 257/40 |

(Continued)

FOREIGN PATENT DOCUMENTS

JP 2001-244467 9/2001
KR 1020020092242 A 12/2002

(Continued)

*Primary Examiner* — Eva Y Montalvo
*Assistant Examiner* — David Goodwin
(74) *Attorney, Agent, or Firm* — Innovation Counsel LLP (57) ABSTRACT

An organic thin film transistor substrate and a method of manufacturing the organic thin film transistor substrate capable of preventing overflow of an organic semiconductor layer. An organic thin film transistor substrate comprises a gate line formed on the substrate, a data line intersecting the gate line, a thin film transistor connected to the gate line and the data line and including an organic semiconductor layer, a pixel electrode connected to the thin film transistor, an organic protective layer protecting the thin film transistor, a first bank-insulating layer providing filling areas in the organic gate insulating layer and the organic semiconductor layer, and a second bank-insulating layer providing the filling area of the organic semiconductor layer together with the first bank-insulating layer and formed on a source electrode and a drain electrode of the thin film transistor.

12 Claims, 13 Drawing Sheets

(56) References Cited

U.S. PATENT DOCUMENTS 7,601,567 B2 * 10/2009 Suh et al. .................. 438/149
2004/0023447 A1 * 2/2004 Hirakata ............ H01L 51/0003
438/149

2006/0258070 A1 * 11/2006 Han .............................. 438/167

FOREIGN PATENT DOCUMENTS

KR  1020030074472 A  9/2003
KR  1020060033481 A  4/2006

* cited by examiner

ORGANIC THIN FILM TRANSISTOR SUBSTRATE AND METHOD OF MANUFACTURING THE SAME

CROSS REFERENCE TO RELATED APPLICATIONS

This application claims priority of Korean Patent Application No. 2006-71235 filed on Jul. 28, 2006 and all the benefits accruing therefrom under 35 U.S.C. §119, the contents of which are herein incorporated by reference in their entirety.

BACKGROUND OF THE INVENTION

1. Field of the Invention

The present invention relates to organic thin film transistor substrates and, more particularly, to a method of manufacturing the organic thin film transistor substrate that prevents overflow of the organic semiconductor layer.

2. Description of the Related Art

In general, liquid crystal displays ("LCDs") display an image in such a way that each of the liquid crystal cells varies its light transmittance responsive to video signals. Each liquid crystal cell includes a thin film transistor ("TFT") used as a switching element for supplying video signals. An active layer of the TFT uses an amorphous silicon layer or a poly silicon layer. Since the amorphous silicon or poly silicon active layer is patterned by a thin film deposition (coating) process, a photolithography process, and an etching process, the manufacturing process is complex and costly. Recently, research and development have been actively conducted using a printing process to form an organic TFT substrate having an organic semiconductor layer. The organic semiconductor layer of the organic TFT substrate is formed by an ink-jet printing method within a hole provided in a bank-insulating layer. However, ink over spray may cause the organic semiconductor layer to overflow out of the hole and penetrate into a pixel electrode.

BRIEF SUMMARY OF THE INVENTION

The present invention provides an organic TFT substrate and a method of manufacturing the TFT substrate capable of preventing overflow of the organic semiconductor layer.

In an exemplary embodiment of the present invention, the organic thin film transistor substrate comprises a gate line formed on the substrate, a data line intersecting the gate line, a thin film transistor connected to the gate line and the data line and including an organic semiconductor layer, a pixel electrode connected to the thin film transistor, a first bank-insulating layer providing filling areas in the organic gate insulating layer and the organic semiconductor layer, and a second bank-insulating layer providing the filling area in the organic semiconductor layer together with the first bank-insulating layer and formed on a source electrode and a drain electrode of the thin film transistor.

In some embodiments, an organic protective layer protecting the thin film transistor is included.

In some embodiments, the gate insulating layer is formed of an organic material.

In some embodiments, a first embodiment of each of the source and drain electrodes comprises a first conductive layer which is a transparent conductive layer, and at least one second conductive layer formed on the first conductive layer, except for an area overlapping a gate electrode of the thin film transistor.

In some embodiments, a second embodiment of each of the source and drain electrodes is formed of a first conductive layer which is a transparent conductive layer.

In some embodiments, the data line is formed by extending the first conductive layer of the source electrode, and the pixel electrode is formed by extending the first conductive layer of the drain electrode.

In some embodiments, the data line is formed by depositing the first and second conductive layers, and the pixel electrode is formed by extending the first conductive layer of the drain electrode.

In some embodiments, the second bank-insulating layer is formed on the second conductive layer to have the same width as the width of the second conductive layer on the second conductive layer, or to be wider than the width of the second conductive layer.

In some embodiments, the second bank-insulating layer is formed of a photosensitive layer.

In some embodiments, the first bank-insulating layer comprises a first sub-bank-insulating layer which provides a first dot hole exposing the gate electrode so that the organic gate insulating layer can be filled, and a second sub-bank-insulating layer connected to the first dot hole and providing a second dot hole wider than the first dot hole so that the organic semiconductor layer and the organic protective layer can be filled.

In an exemplary embodiment of the present invention, a method of manufacturing an organic thin film transistor substrate comprises forming a gate line and a gate electrode connected to the gate line on the substrate, forming a first bank-insulating layer exposing the gate electrode, forming a gate insulating layer to be filled within the first bank-insulating layer, forming a data line intersecting the gate line, a source electrode connected to the data line, a drain electrode facing the source electrode, and a pixel electrode connected to the drain electrode, and forming a second bank-insulating layer formed on the source electrode, the drain electrode, and the data line, and forming an organic semiconductor layer comprising a channel between the source electrode and the drain electrode within an area provided in the first bank-insulating layer and the second bank-insulating layer.

In some embodiments, forming an organic protective layer to cover the organic semiconductor layer is included.

In some embodiments, the forming of the data line, the source electrode, the drain electrode, the pixel electrode, and the second bank-insulating layer comprises sequentially forming on a substrate, on which the organic gate insulating layer is formed, a first conductive layer and at least one second conductive layer, forming a second bank-insulating layer having a stepped structure on the second conductive layer, forming a source/drain metal pattern including the data line, the source electrode, and the drain electrode, and the pixel electrode on the first bank-insulating layer by patterning the first and second conductive layers using the second bank-insulating layer as a mask, exposing the second conductive layer of the pixel electrode and the second conductive layer of each of the source and drain electrodes in a channel area by ashing the second bank-insulating layer, and removing the second conductive layer exposed.

In some embodiments, the first conductive layer is formed of a transparent conductive layer.

In some embodiments, the second conductive layer is formed of an opaque metal.

In some embodiments, the second bank-insulating layer is formed on the second conductive layer to have the same width as the width of the second conductive layer or to be wider than the width of the second conductive layer. In some embodiments, the second bank-insulating layer is formed of a photosensitive layer.

In some embodiments, the forming of the first bank-insulating layer comprises forming a first sub-bank-insulating layer which prepares a first dot hole exposing the gate electrode so that the organic gate insulating layer is filled, and forming a second sub-bank-insulating layer which is connected to the first dot hole and a second dot hole wider than the first dot hole so that the organic semiconductor layer and the organic protective layer are filled.

BRIEF DESCRIPTION OF THE DRAWINGS

The above and other features and advantages of the present invention will become readily apparent by reference to the following detailed description when considered in conjunction with accompany drawings, in which.

DETAILED DESCRIPTION OF THE INVENTION

Exemplary embodiments of the present invention are described with reference to the accompanying drawings in detail. The same reference numbers will be used throughout the drawings to refer to the same or like parts. Detailed descriptions of well-known functions and structures incorporated herein may be omitted to avoid obscuring the subject matter of the present invention.

Figure 1:
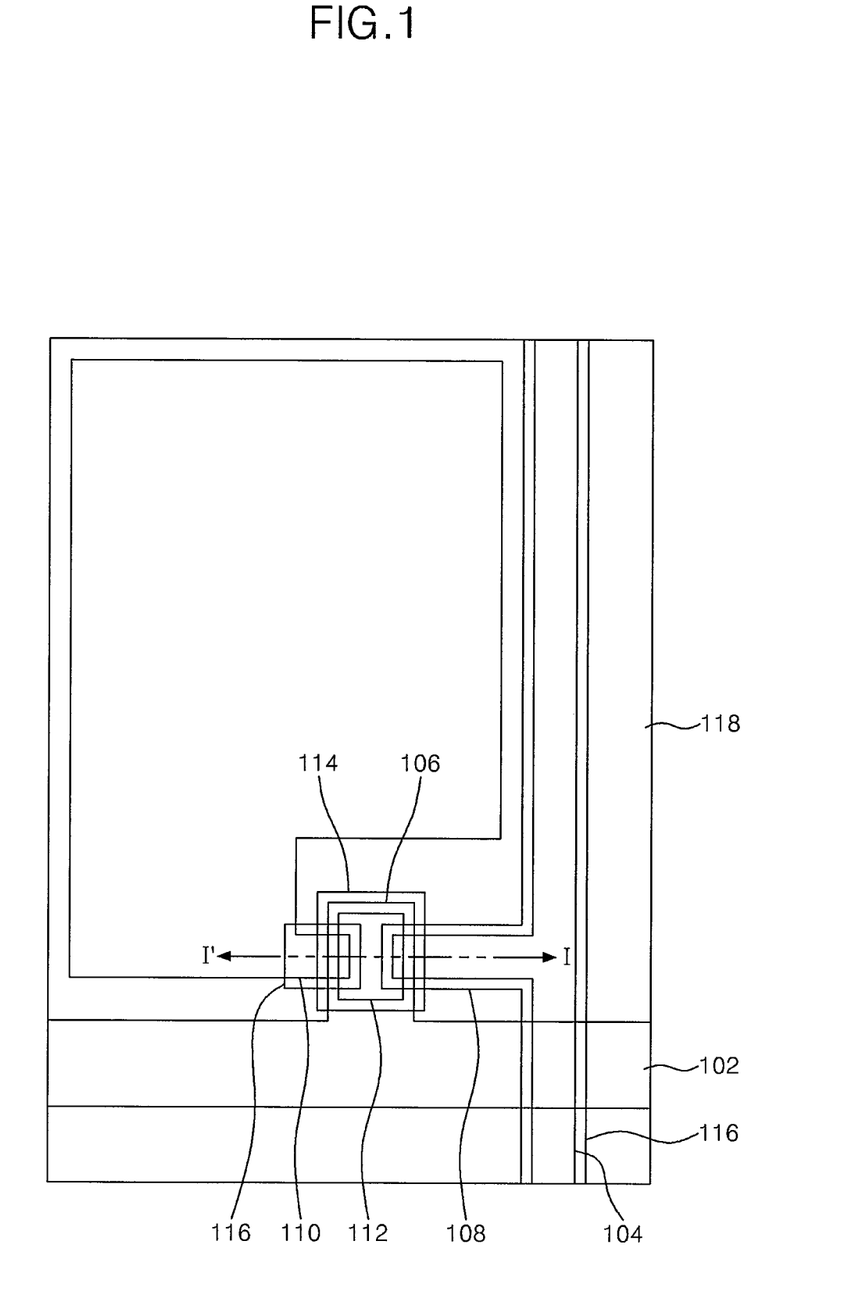
FIG. 1 is a plan view showing an organic TFT substrate in accordance with an exemplary embodiment of the present invention.
Figure 2:
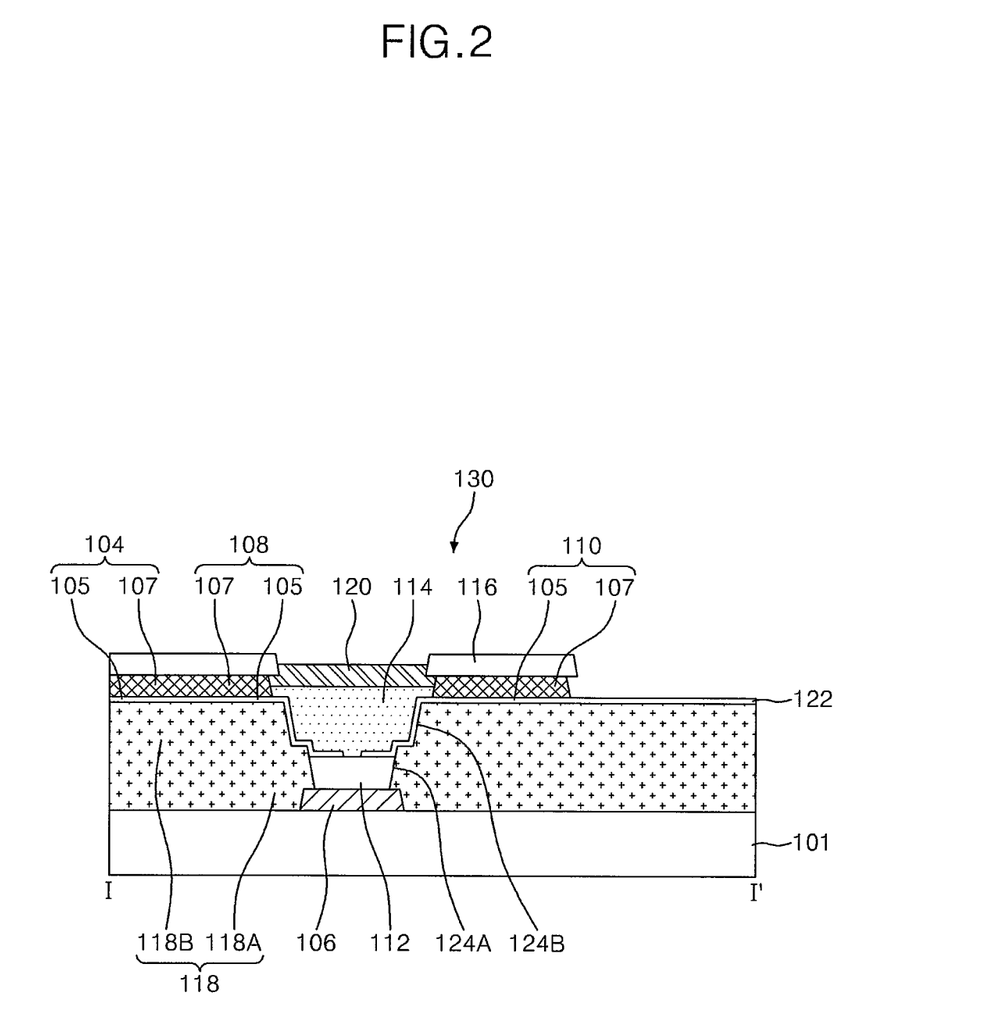
FIG. 2 is a cross-sectional view taken along line I-I' of the organic TFT substrate shown in FIG. 1.

FIG. 1 is a plan view showing an organic TFT substrate in accordance with an exemplary embodiment of the present invention and FIG. 2 is a cross-sectional view taken along line I-I' of the organic TFT substrate shown in FIG. 1.

An organic TFT substrate shown in FIGS. 1 and 2 comprises a gate line 102 and a data line 104 formed to intersect each other with a first bank-insulating layer 118 interposed therebetween on a lower substrate 101, a TFT 130 formed in an intersecting area of the gate and data lines 102 and 104, and a pixel electrode 122 formed in a sub-pixel area provided by the intersecting structure of the gate and data lines 102 and 104 and connected to the TFT 130.

The gate line 102 supplies a scan signal from a gate driver (not shown) and the data line 104 supplies a pixel signal from a data driver (not shown).

The data line 104 is formed in a single layer or multi-layer structure including a transparent conductive layer on the first bank-insulating layer 118. For example, the data line 104 is formed in a double layer structure having a first conductive layer 105 using a transparent conductive layer and a second conductive layer 107 using an opaque metal. The first conductive layer 105 uses ITO (Indium Tin Oxide), TO (Tin Oxide), IZO (Indium Zinc Oxide), ITZO (Indium Tin Zinc Oxide), etc. The second conductive layer 107 is formed in a single layer structure composed of a metal such as copper (Cu), molybdenum (Mo), aluminum (Al), Cu alloy, Mo alloy, and Al alloy or in a multi-layer structure using these metals, such as Mo/Al/Mo.

The TFT 130 causes a pixel signal, which is supplied to the data line 104 responsive to a scan signal supplied to the gate line 102, to be charged and stored in the pixel electrode 122. The TFT 130 comprises a gate electrode 106 connected to the gate line 102, a source electrode 108 connected to the data line 104, a drain electrode 110 facing the source electrode 108 and connected to the pixel electrode 122. An organic semiconductor layer 114 overlaps the gate electrode 106 with an organic gate insulating layer 112 interposed therebetween to form a channel between the source electrode 108 and the drain electrode 110.

The gate electrode 106 is exposed by a first dot hole 124A which is prepared in a first sub-bank-insulating layer 118A. The source and drain electrodes 108 and 110 include a first and second conductive layers 105, 107 overlapping the gate electrode 106. The source and drain electrodes 108 and 110 are formed having a stepwise shape along a stepped structure prepared in the first bank-insulating layer 118 and the gate insulating layer 112. As a result, the channel width between the source and drain electrodes 108 and 110 is increased, thereby improving the current property of the organic TFT 130.

The organic semiconductor layer 114 is formed on the organic gate insulating layer 112 in an area prepared in the first and second bank-insulating layers 118 and 116 so as to contact with the source and drain electrodes 108, 110 each formed of the first conductive layer 105 in the channel area.

The organic semiconductor layer 114 is formed of an organic semiconductor material, for example, pentacene, tetracene, anthracene, naphthalene, α-6T, α-4T, perylene and derivative thereof, rubrene and derivative thereof, coronene and derivative thereof, perylene tetracarboxylic diimide and derivative thereof, perylene tetracarboxylic dianhydride and derivative thereof, phthalocyanine and derivative thereof, naphthalene tetracarboxylic diimide and derivative thereof, naphthalene tetracarboxylic dianhydride and derivative thereof, conjugated polymer derivative containing a substituted or non-substituted thiophene, conjugated polymer derivative containing a substituted fluorine, etc.

The organic semiconductor layer 114 provides ohmic-contact with the source and drain electrodes 108 and 110 by a self-assembled monolayer (SAM) treatment process. More specifically, a difference of work functions between each of the source and drain electrodes 108 and 110 and the organic semiconductor layer 114 is reduced by the SAM treatment process. Accordingly, a hole injection into the organic semiconductor layer 114 from the source and drain electrodes 108 and 110 is easily implemented and a contact resistance between each of the source and drain electrodes 108 and 100 and the organic semiconductor layer 114 is also reduced.

The TFT 130 is protected by an organic protective layer 120. The organic protective layer 120 is formed within a second dot hole 124B provided in second sub-bank-insulating layer 118B and in the second bank-insulating layer 116.

The first bank-insulating layer 118 is stepwise formed to prepare the first and second dot holes 124A and 124B exposing the gate electrode 106. In other words, the first bank-insulating layer 118 comprises the first sub-bank-insulating layer 118A formed to provide the first dot hole 124A on the lower substrate 101, and the second sub-bank-insulating layer 118B formed to be thicker than the first sub-bank-insulating layer 118A and to provide the second dot hole 124B. The area exposed by the first dot hole 124A has a hydrophilic property with the organic gate insulating layer 112, and the remaining area has a hydrophobic property with the organic gate insulating layer 112. The area exposed by the second dot hole 124B has a hydrophilic property with the organic semiconductor layer 114 and the organic protective layer 120, and the remaining area has a hydrophobic property with the organic semiconductor layer 114 and the organic protective layer 120. The second dot hole 124B is connected to the first dot hole 124A and has a wider width than the first dot hole 124A.

The second bank-insulating layer 116 is formed of a photosensitive organic layer and used as a mask pattern when the data line 104, the source electrode 108, and the drain electrode 110 are formed. The second bank-insulating layer 116 is formed to be wider than the width of the second conductive layer 107 on the second conductive layer 107 of each of the data line 104 and the source and drain electrodes 108 and 110. The second bank-insulating layer 116 prevents the organic semiconductor layer 114 formed by an ink-jet printing method from penetrating into the pixel electrode 122. The channel area exposed by the second bank-insulating layer 116 has a hydrophilic property with the organic semiconductor layer 114 and the remaining area has a hydrophobic property with the organic semiconductor layer 114.

The pixel electrode 122 is formed on the second sub-bank-insulating layer 118B by extending the first conductive layer 105, which is the transparent conductive layer of the drain electrode 110.

Upon receiving video signals through the TFT 130, the pixel electrode 122 forms an electric field with the common electrode. The liquid crystal molecules aligned between the TFT substrate and the color filter substrate are rotated by dielectric anisotropy, thereby varying the transmittance of light through the pixel area and implementing a gray scale.

While the source and drain electrodes 108 and 110 have been described as having been formed by depositing the first and second conductive layers 105 and 107 along with the data line 104, the source and drain electrodes 108 and 110 may be formed only of the first conductive layer 105 being a transparent conductive layer. In this case, a mask pattern of the second bank-insulating layer 116 used similar to that used to pattern the source and drain electrodes 108, 110, and the data line 104.

Figure 3A:
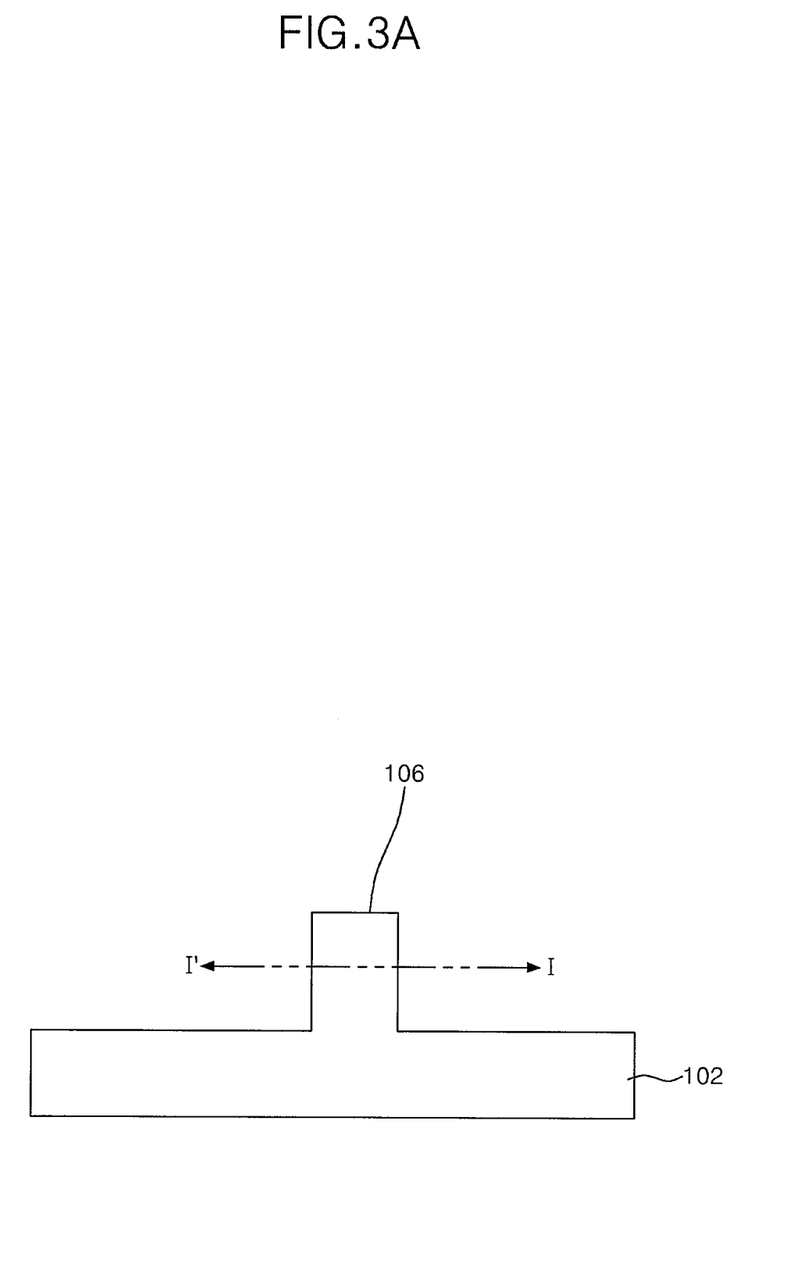
FIGS. 3A and 3B are a plan view and a cross-sectional view, respectively, illustrating a method of manufacturing a gate metal pattern shown in FIGS. 1 and 2.
Figure 3B:
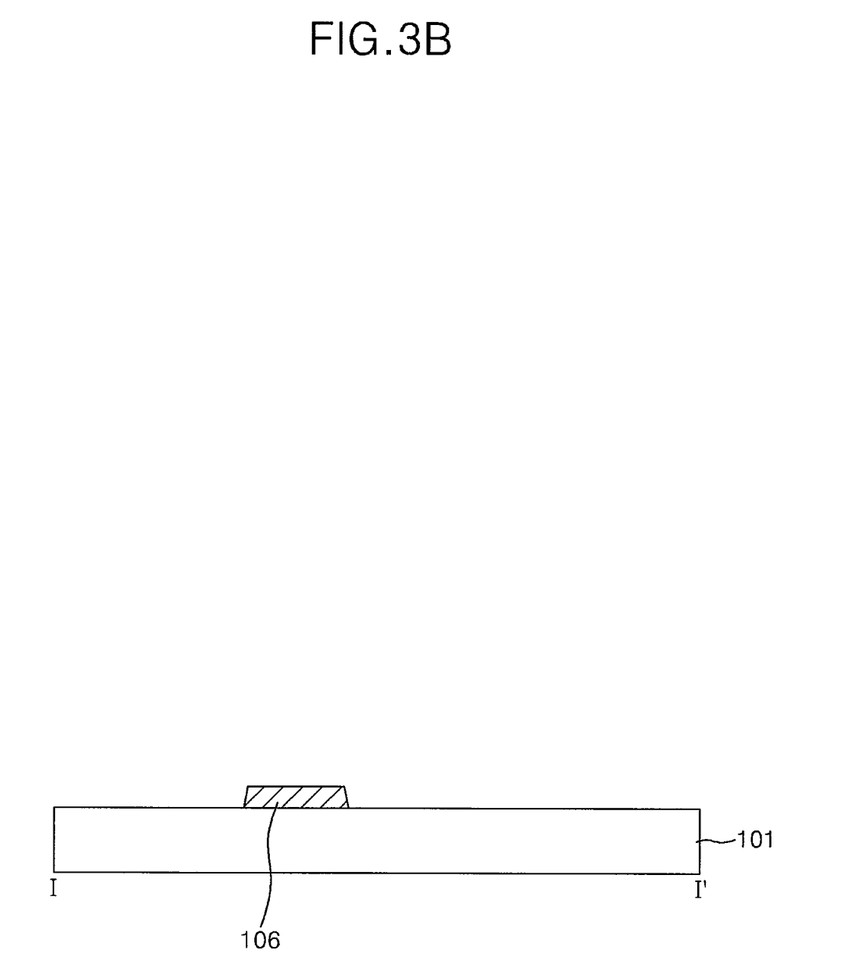

FIGS. 3A and 3B are a plan view and a cross-sectional view, respectively, illustrating a method of manufacturing a gate metal pattern of the TFT substrate in accordance with the present invention.

As shown in FIGS. 3A and 3B, a gate metal pattern including the gate line 102 and the gate electrode 106 is formed by a first mask process on the lower substrate 101.

More specifically, a gate metal layer is deposited on the lower substrate 101, and then the gate metal layer is patterned by a photolithography process and an etching process to form the gate metal pattern including the gate line 102 and the gate electrode 106. Herein, the gate metal layer is formed of a single layer composed of a metal such as Mo, titanium (Ti), Cu, aluminum neodymium (AlNd), Al, Cr, Mo alloy, Cu alloy, and Al alloy or at least a double-stacked layer having these metals.

Figure 4A:
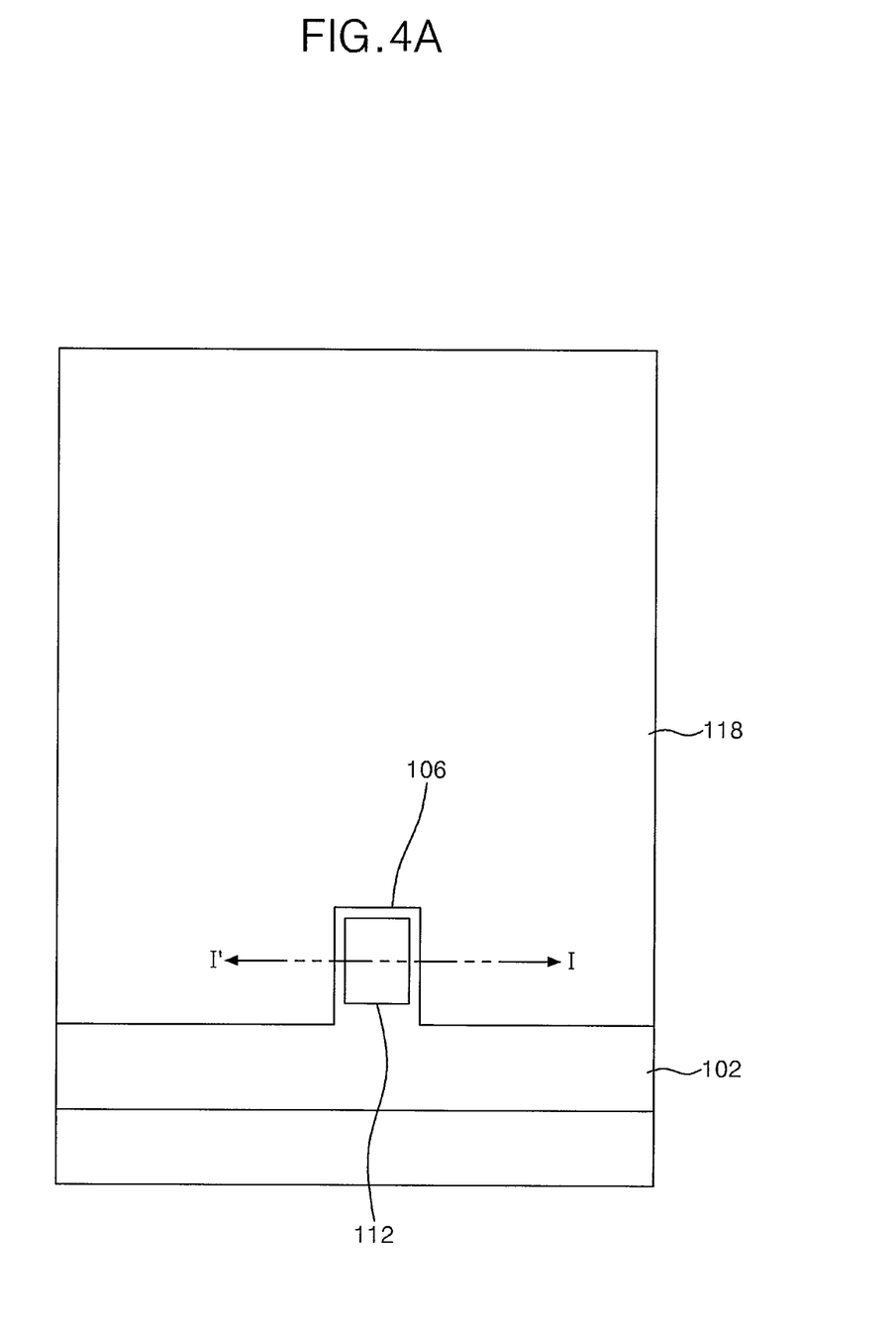
FIGS. 4A and 4B are a plan view and a cross-sectional view, respectively, illustrating a method of manufacturing a first bank-insulating layer and an organic gate insulating layer shown in FIGS. 1 and 2.
Figure 4B:
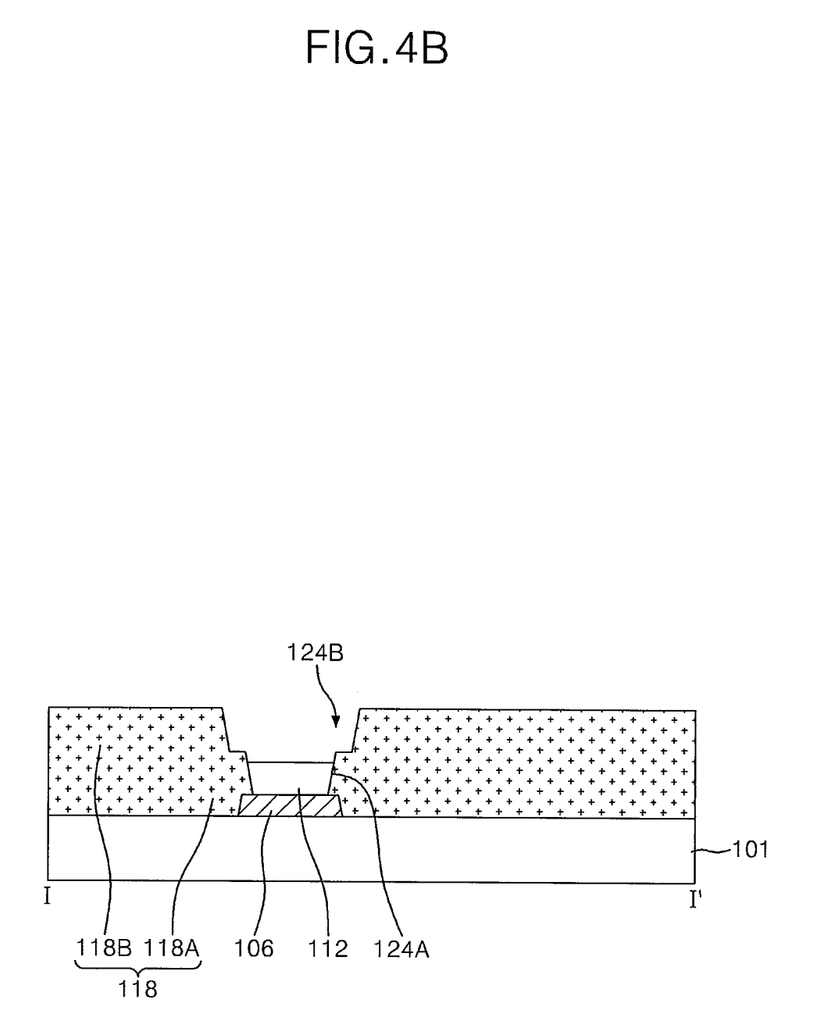

FIGS. 4A and 4B are a plan view and a cross-sectional view, respectively, illustrating a method of manufacturing the first bank-insulating layer 118 and the organic gate insulating layer 112.

As shown in FIGS. 4A and 4B, the first bank-insulating layer 118 including first and second sub-bank-insulating layers 118A and 118B is formed on the lower substrate 101. The organic gate insulating layer 112 is formed within the first dot hole 124A provided in the first bank-insulating layer 118, as will now be described in detail with reference to FIGS. 5A to 5C.

Figure 5A:
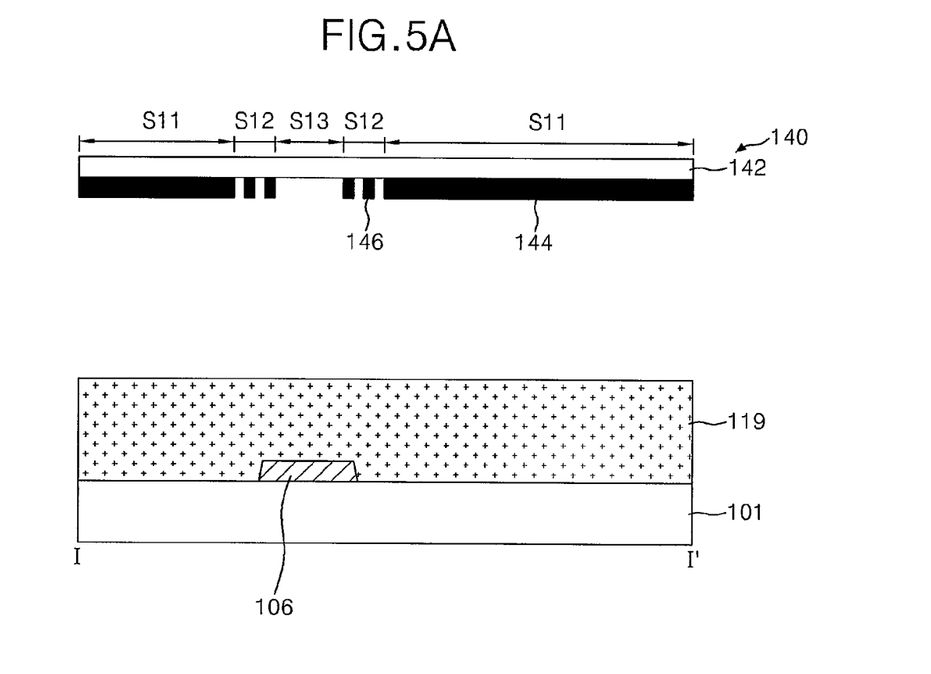
FIGS. 5A to 5C are cross-sectional views illustrating a method of manufacturing the first bank-insulating layer and the organic gate insulating layer shown in FIG. 4B.
Figure 5B:
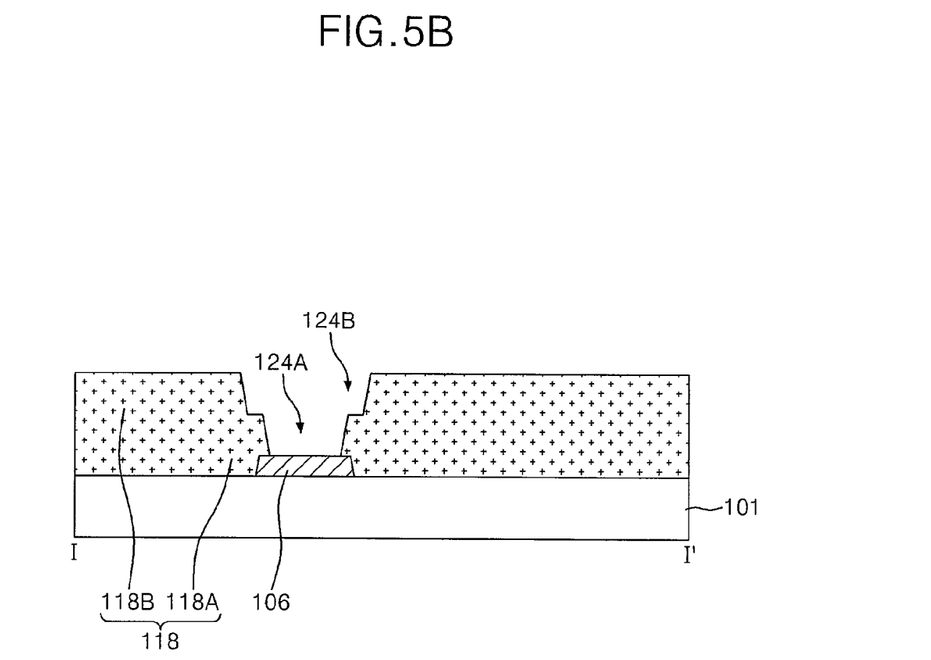
Figure 5C:
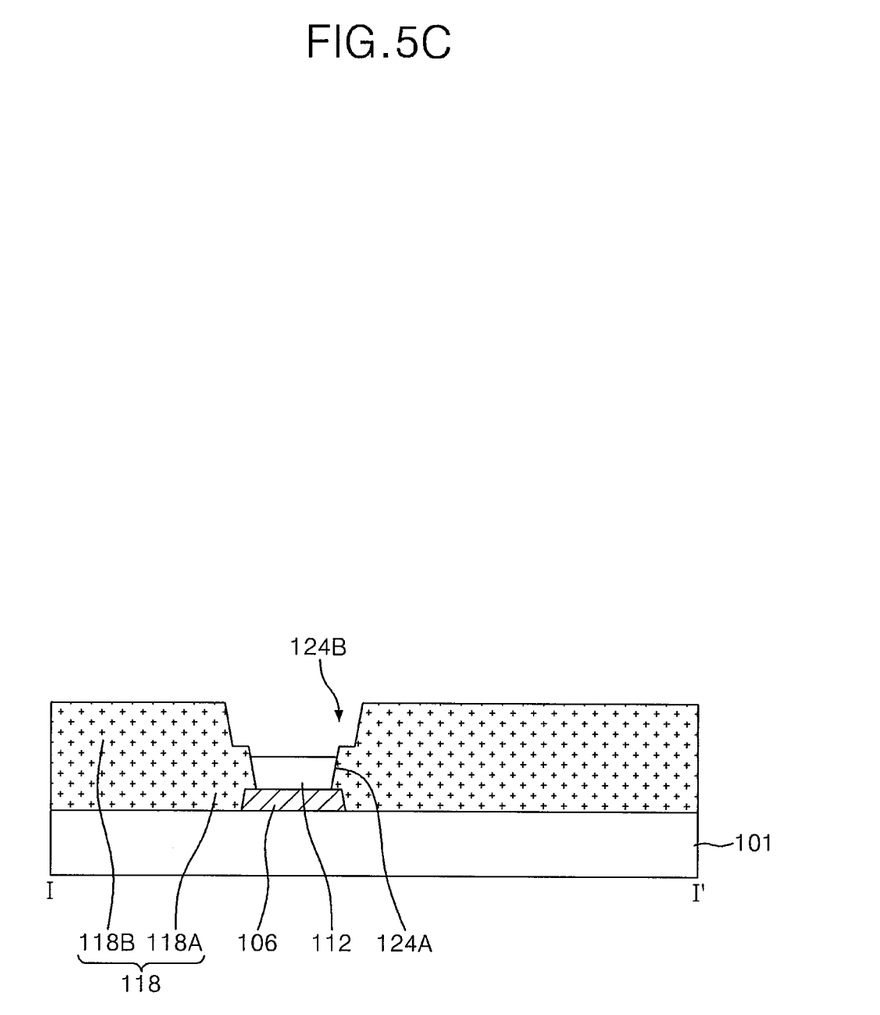

As shown in FIG. 5A, a photosensitive organic insulating material 119 is deposited on the entire surface of the lower substrate 101 by a spinless or spin coating method. Then, a slit mask 140 is aligned on the lower substrate 101. The slit mask 140 comprises a blocking area S11 in which a blocking layer 144 is formed on a quartz substrate 142, a slit area S12 in which slits 146 are formed on the quartz substrate 142, and a transmitting area S13 in which only the quartz substrate 142 exists. As shown in FIG. 5B, blocking area S11 blocks ultraviolet rays in the exposing process. After a developing process, the second sub-bank-insulating layer 118B is formed on the lower substrate 101 of an area that corresponds to the blocking area S11. The slit area S12 diffracts ultraviolet rays in the exposing process. After the developing process, the first sub-bank-insulating layer 118A is formed to be thinner than the thickness of the second sub-bank-insulating layer 118B on the lower substrate 101 of an area that corresponds to the slit area S12. The second dot hole 124B is formed, as shown in FIG. 5B. The transmitting area S13 transmits all of the ultraviolet rays in the exposing process and, after the developing process, the first dot hole 124A connected to the second dot hole 124B is formed on the lower substrate 101. Then, as shown in FIG. 5C, an organic insulation solution is sprayed into the first dot hole 124A using an ink-jet printing apparatus and cured, thereby forming the organic gate insulating layer 112 filled the first dot hole 124A. The organic gate insulating layer 112 is formed to be thinner than the depth of the first dot hole 124A. The organic gate insulating layer 112 uses polyvinyl pyrrolidone (PVP), polymethlymethacrylate (PMMA), benzocyclobutene (BCB), polyimide, polyvinylphenol, parylene, etc.

In some embodiments, before spraying the organic insulation solution, the lower substrate 101, on which the first bank-insulating layer 118 is formed, may undergo surface treatment. The area exposed by the first dot hole 124A through the surface treatment process has a hydrophilic property with the organic insulation solution, and the remaining area has a hydrophobic property with the organic insulation solution. Then, when the organic insulation solution is sprayed on the lower substrate 101, the organic insulation solution is concentrated on the area exposed by the first dot hole 124A having a hydrophilic property with the organic insulation solution to form the organic gate insulating layer 112. Accordingly, overflow of the organic gate insulating layer 112 may be prevented.

Alternatively, the first bank-insulating layer 118 may be formed of a material having a hydrophobic property with the organic insulation solution. For example, the first bank-insulating layer 118 may be formed of an insulating material having a fluorine group. When the organic insulation solution is sprayed on the lower substrate 101 on which the first bank-insulating layer 118 is formed, the organic insulation solution is concentrated on the area exposed by the first dot hole 124A to form the organic gate insulating layer 112.

Figure 6A:
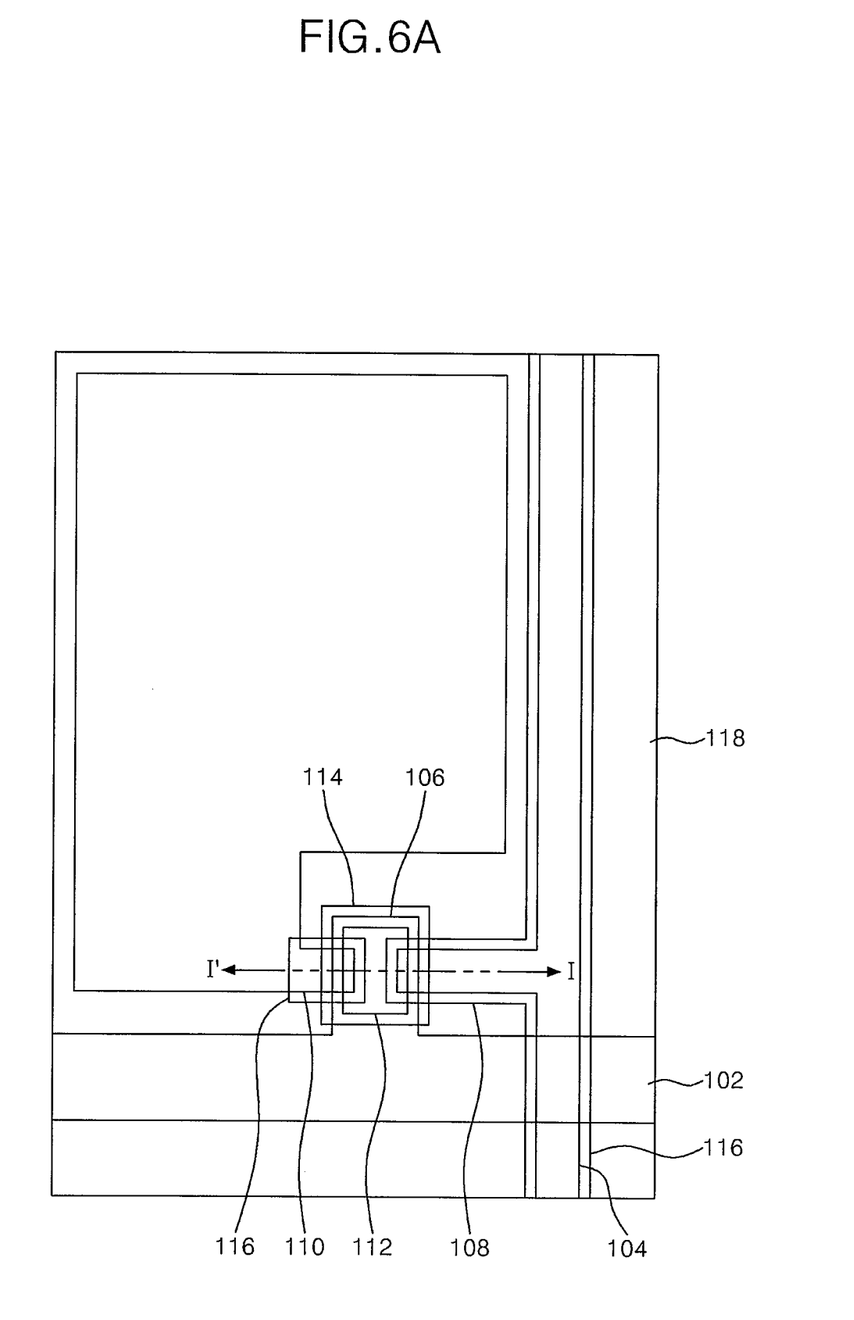
FIGS. 6A and 6B are a plan view and a cross-sectional view, respectively, illustrating a method of manufacturing a source/drain metal pattern, a pixel electrode, an organic semiconductor layer, a second bank-insulating layer, and an organic protective layer shown in FIGS. 1 and 2.
Figure 6B:
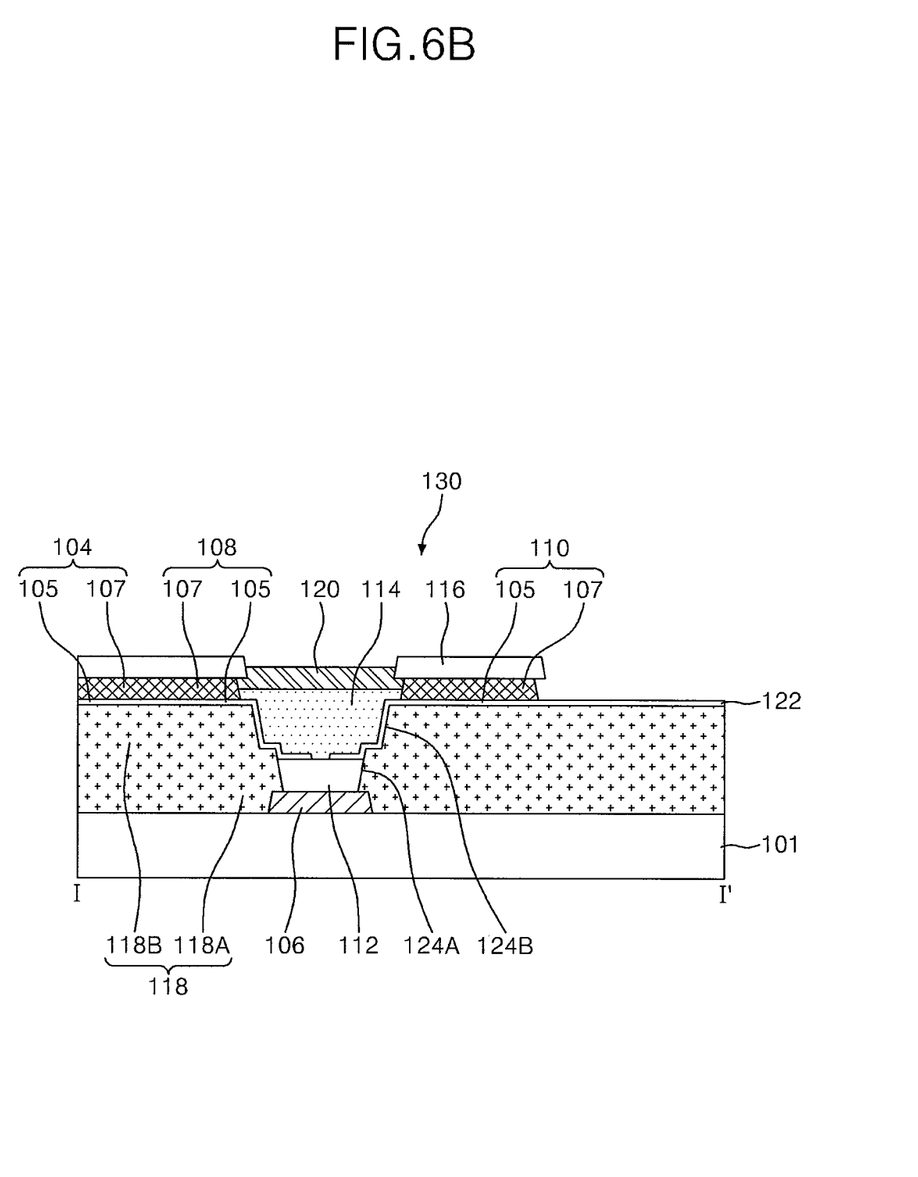

FIGS. 6A and 6B are a plan view and a cross-sectional view, respectively, illustrating a method of manufacturing a source/drain metal pattern, the pixel electrode 122, the second bank-insulating layer 116, the organic semiconductor layer 114, and the organic protective layer 120 among a method of manufacturing the TFT substrate in accordance with the present invention.

As shown in FIGS. 6A and 6B, the source/drain metal pattern including the data line 104, the source electrode 108, and the drain electrode 110, the pixel electrode 122, and the second bank-insulating layer 116 are formed on the lower substrate 101 on which the organic gate insulating layer 112 is formed, and then the organic semiconductor layer 114 and the organic protective layer 120 are sequentially formed. In this regard, it will now be described in detail with reference to FIGS. 7A to 7E.

Figure 7A:
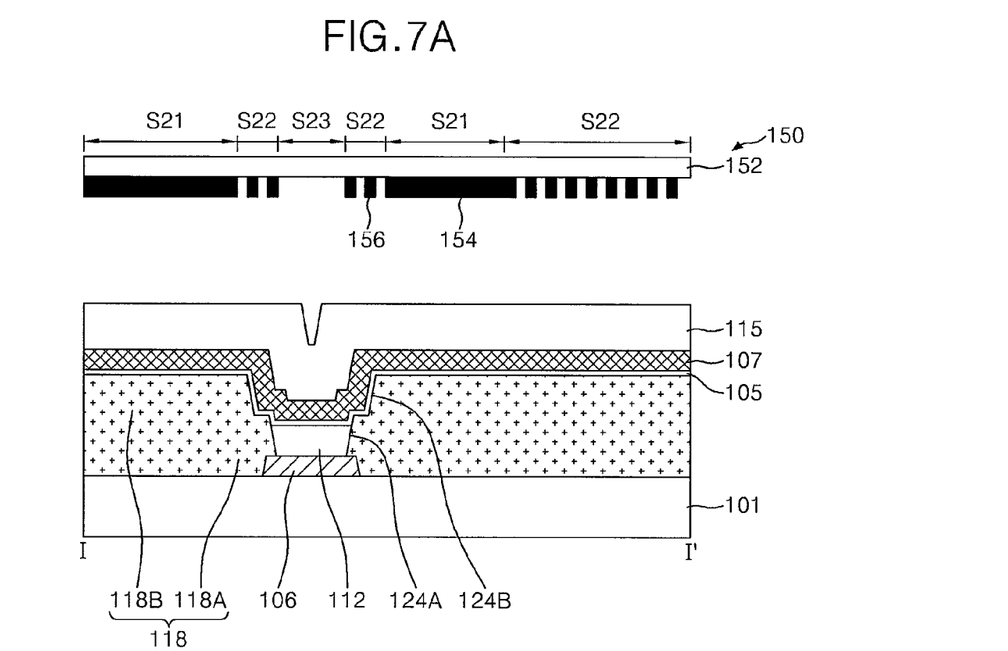
FIGS. 7A to 7E are cross-sectional views illustrating a method of manufacturing the source/drain metal pattern, the pixel electrode, the organic semiconductor layer, the second bank-insulating layer, and the organic protective layer shown in FIG. 6B.

As shown in FIG. 7A, the first and second conductive layers 105 and 107 are deposited by a deposition method such as a sputtering method on the lower substrate 101 on which the organic gate insulating layer 112 is formed. The first conductive layer 105 is formed of a transparent conductive material, such as ITO, TO, IZO, and ITZO, and the second conductive layer 107 is formed of a single layer composed of a metal such as Mo, Ti, Cu, AlNd, Al, Cr, Mo alloy, Cu alloy, and Al alloy, or at least a double-stacked layer having these metals.

Then, a photosensitive organic layer 115 such as photoresist or photo-acryl resin is formed on the second conductive layer 107. Next, the photosensitive organic layer 115 is exposed and developed by a photolithography process using a transreflective mask or a slit mask 150, thereby forming the second bank-insulating layer 116 having a stepped structure, as shown in FIG. 7B.

More specifically, the slit mask 150 comprises a blocking area S21 in which a blocking layer 154 is formed on a quartz substrate 152, a slit area S22 in which slits 156 are formed on the quartz substrate 152, and a transmitting area S23 in which only the quartz substrate 152 exists. The blocking area S21 is positioned in an area in which the source electrode, the drain electrode, and the data line are to be formed. The blocking area S21 blocks ultraviolet rays in an exposing process, and after a developing process, the second bank-insulating layer 116 having a first thickness h1 is formed, as shown in FIG. 7B. The slit area S22 is formed in an area in which the source and drain electrodes corresponding to a channel area and the pixel electrode are to be formed. The slit area S22 diffracts ultraviolet rays in the exposing process, and then after a developing process, the second bank-insulating layer 116 having a second thickness h2 thinner than the first thickness h1 is formed, as shown in FIG. 7B. The transmitting area S23 transmits all of ultraviolet rays, and then after the developing process, the photosensitive organic layer 115 is removed, as shown in FIG. 7B.

Figure 7B:
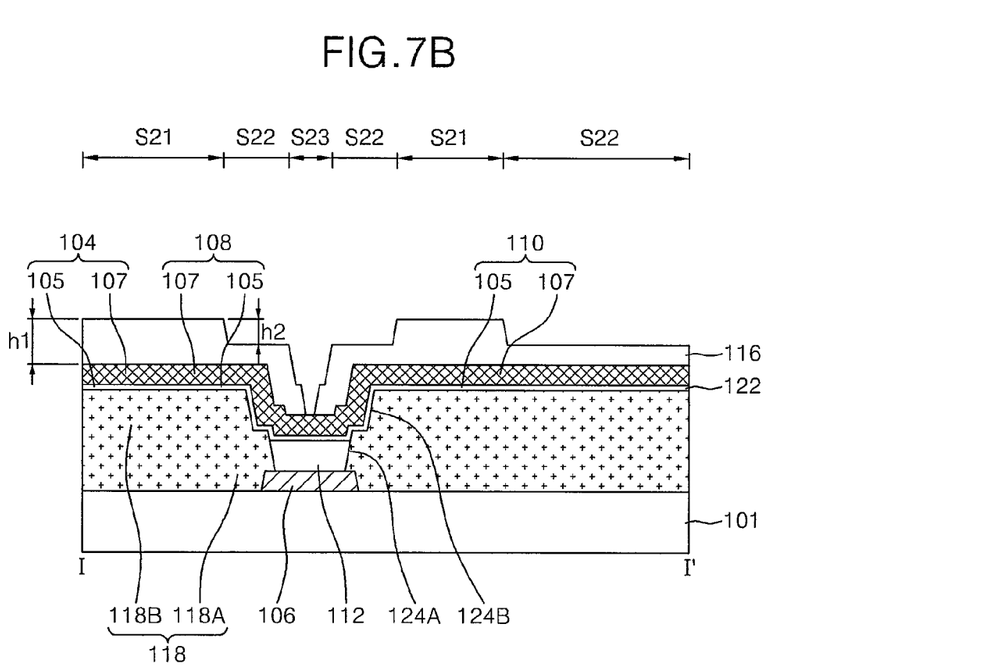

The first and second conductive layers 105 and 107 are patterned by an etching process using the second bank-insulating layer 116 as a mask, thereby forming the source/drain metal pattern of a multi-layer structure including the data line 104, the source electrode 108, and the drain electrode 110, and the pixel electrode 122, as shown in FIG. 7B.

Figure 7C:
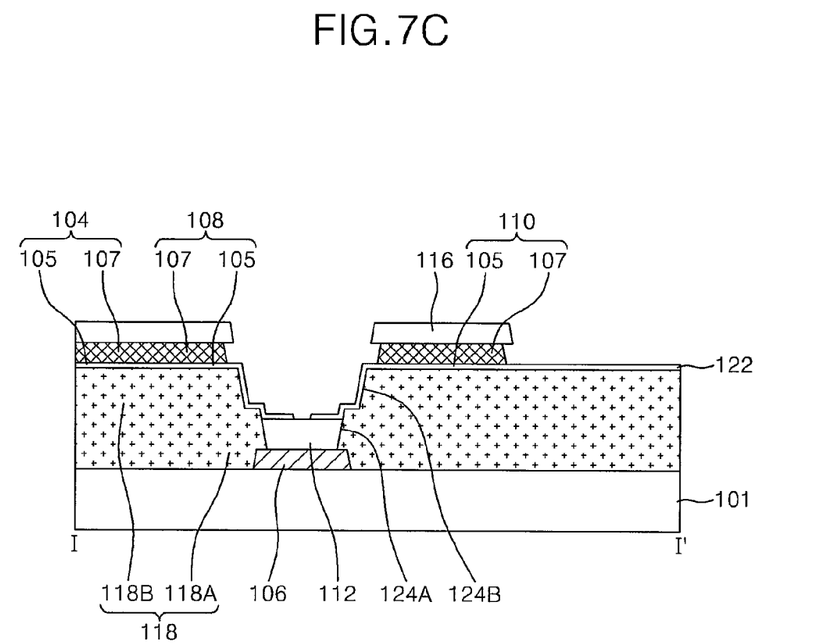

Thereafter, as shown in FIG. 7C, the thickness of the second bank-insulating layer 116 with the first thickness h1 becomes thin by an ashing process using $O_2$ plasma, and the second bank-insulating layer 116 with the second thickness h2 is removed. The second conductive layer 107 formed on the pixel electrode 122 and the second conductive layer 107 of the source and drain electrodes 108 and 110 corresponding to the channel area are removed by the etching process using as a mask the second bank-insulating layer 116 ashed. At this time, the second conductive layer 107 of the source and drain electrodes 108 and 110 is formed to have the same width as the width of the second bank-insulating layer 116 or overly etched to have the width narrower than the width of the second bank-insulating layer 116.

Figure 7D:
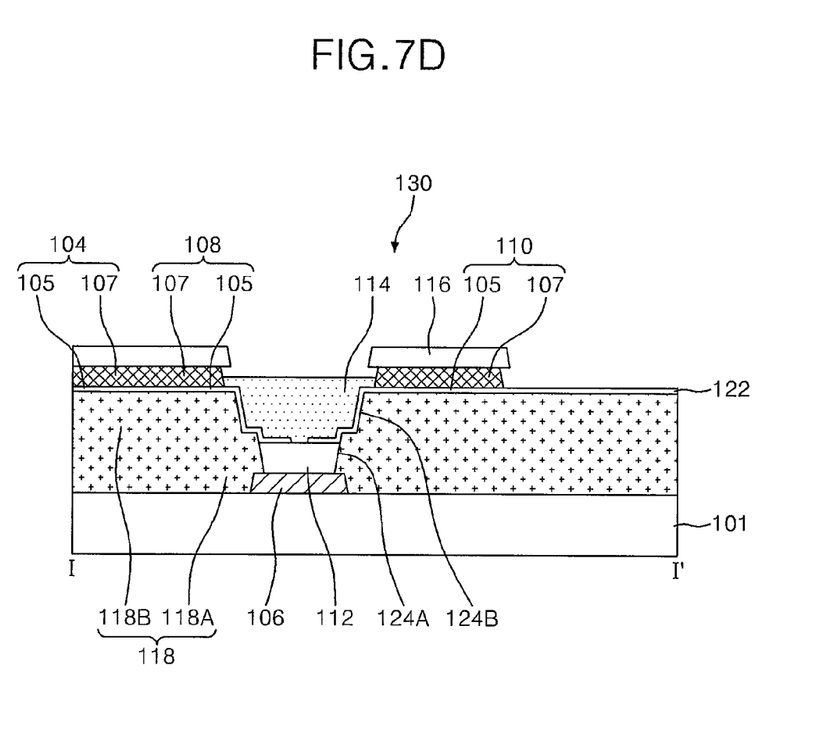

Thereafter, an organic semiconductor solution of a liquid state is sprayed into the second dot hole 124B defined by the second bank-insulating layer 116 and the second sub-bank-insulating layer 118B by using an ink-jet printing method. Then, the organic semiconductor solution is cured, and the organic semiconductor layer 114 of a solid state is formed, as shown in FIG. 7D.

In some embodiments, before spraying the organic semiconductor solution, the lower substrate 101 on which the source/drain metal pattern, the pixel electrode 122, and the second bank-insulating layer 116 are formed may undergo surface treatment. An area exposed through the second dot hole 124B defined by the second bank-insulating layer 116 and the second sub-bank-insulating layer 118B has a hydrophilic property with the organic semiconductor solution and a remaining area has a hydrophobic property with the organic semiconductor solution by the surface treatment process. Then, when the organic semiconductor solution is sprayed on the lower substrate 101, it is concentrated on the gate insulating layer 112 having a hydrophilic property with the organic semiconductor solution of a liquid state and an exposed portion of the first conductive layer 105 of the source and drain electrodes 108, 110, thereby forming the organic semiconductor layer 114. As a result, overflow of the organic semiconductor layer 114 is prevented.

Alternatively, when the first bank-insulating layer 118 is formed of a material having a hydrophobic property with the organic semiconductor solution, the organic semiconductor solution is concentrated on the gate insulating layer 112, thereby preventing overflow of the organic semiconductor layer 114.

After the organic semiconductor layer 114 is formed, it is treated by a SAM process. Accordingly, the organic semiconductor layer 114 provides ohmic-contact with the source and drain electrodes 108 and 110.

Figure 7E:
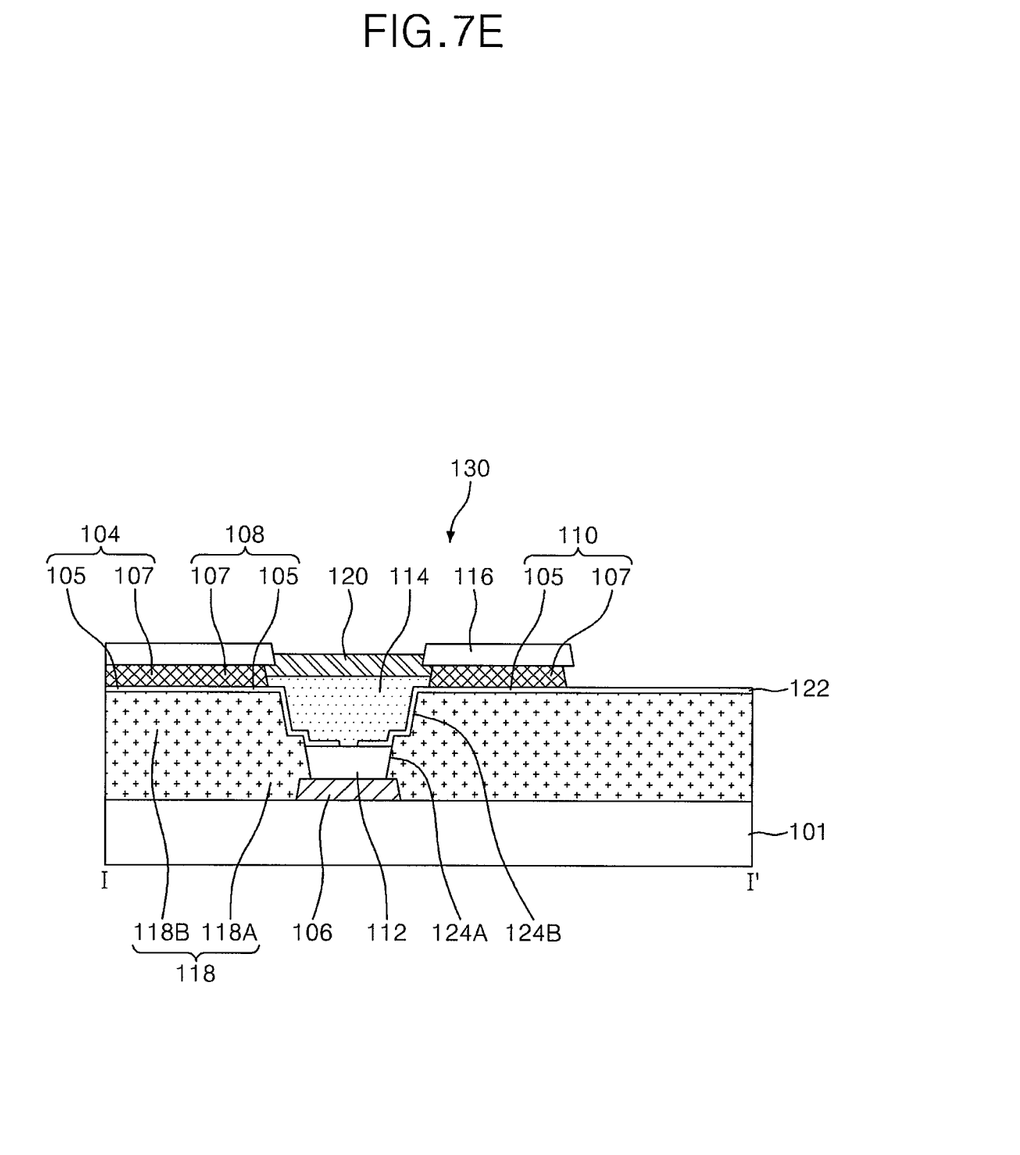

Thereafter, an organic protective solution such as polyvinyl alcohol (PVA) is sprayed by an ink-jet printing method into the second dot hole 124B prepared by the second sub-bank-insulating layer 118B and the second bank-insulating layer 116, and then the organic protective solution is cured, thereby forming the organic protective layer 120 within an area provided in the second bank-insulating layer 116, as shown in FIG. 7E.

In some embodiments, before spraying the organic protective solution, the lower substrate 101, on which the organic semiconductor layer 114 is formed, may undergo surface treatment. An area exposed by the second bank-insulating layer 116 has a hydrophilic property with the organic protective solution and a remaining area has a hydrophobic property with the organic protective solution by the surface treatment process. Then, when the organic protective solution is sprayed on the lower substrate 101, the organic protective solution is concentrated on an area having the hydrophilic property with the organic protective solution to form the organic protective layer 120.

As described above, the organic TFT substrate and a method of manufacturing the organic TFT substrate according to the present invention forms the second bank-insulating layer on the second conductive layer of each of the source and drain electrodes. The second bank-insulating layer may prevent the organic semiconductor layer interposed between the source and drain electrodes from penetrating into the pixel electrode.

While this invention has been described in connection with what is presently considered practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic thin film transistor substrate comprising:
    a substrate;
    a gate electrode on the substrate;
    a gate line connected to the gate electrode;
    a data line connected to a source electrode;
    a first bank-insulating layer disposed on the substrate to cover a portion of the gate electrode, the first bank-insulating layer having a recess positioned over the gate electrode;
    an organic gate insulating pattern directly disposed on a portion of the gate electrode and disposed on the recess, except for a portion thereof covered by the first bank-insulating layer, wherein the organic gate insulating pattern does not overlap the gate line;
    the source electrode and a drain electrode on the first bank-insulating layer and the organic gate insulating pattern, wherein the source electrode and the drain electrode partially overlap the recess;
    an organic semiconductor pattern disposed on the recess contacting the source electrode and the drain electrode; and
    a pixel electrode connected to the drain electrode,
    wherein each of the portions of the source and drain electrodes that overlap the recess are disposed between the organic gate insulating pattern and the organic semiconductor.

2. The organic thin film transistor substrate of claim 1, wherein each of the source and drain electrode comprises a first conductive layer and a second conductive layer, and the first conductive layer is formed of a transparent material.

3. The organic thin film transistor substrate of claim 2, wherein the second conductive layer of the source and drain electrodes has a width narrower than or the same as a width of the second bank-insulating pattern.

4. The organic thin film transistor substrate of claim 2, wherein the data line is extended from the source electrode, and the pixel electrode is extended from the drain electrode.

5. An organic thin film transistor substrate comprising:
    a substrate;
    a gate electrode on the substrate;
    a first bank-insulating layer disposed on the substrate to cover a portion of the gate electrode, the first bank-insulating layer having a recess positioned over the gate electrode;
    an organic gate insulating pattern directly disposed on a portion of the gate electrode and disposed on the recess, except for a portion thereof covered by the first bank-insulating layer;
    a source electrode and a drain electrode on the first bank-insulating layer and the organic gate insulating pattern, wherein the source electrode and the drain electrode partially overlap the recess;
    an organic semiconductor pattern disposed on the recess contacting the source electrode and the drain electrode; and
    a pixel electrode connected to the drain electrode,
    wherein each of the portions of the source and drain electrodes that overlap the recess are disposed between the organic gate insulating pattern and the organic semiconductor, and
    wherein the first bank-insulating layer comprises:
        a first sub-bank-insulating layer on the substrate and the portion of the gate electrode, and the first sub-bank-insulating layer having a first dot hole defined in the first sub-bank-insulating layer; and
        a second sub-bank-insulating layer on the first sub-bank-insulating layer, and the second sub-bank-insulating layer having a second dot hole defined in the second sub-bank-insulating layer,
    wherein the first dot hole overlaps the second dot hole, and the first dot hole and the second dot hole define the recess, and
    wherein the organic gate insulating pattern is disposed in the first dot hole and the organic semiconductor pattern is disposed in the second dot hole,
    wherein a width of the second dot hole is larger than a width of the first dot hole, and
    wherein the organic semiconductor pattern has a width larger than a width of the organic gate insulating pattern.

6. The organic thin film transistor substrate of claim 5, wherein the first sub-bank-insulating layer has a thickness larger than a thickness of the organic gate insulating pattern.

7. The organic thin film transistor substrate of claim 1, wherein the first bank-insulating pattern comprises hydrophobic material.

8. The organic thin film transistor substrate of claim 7, wherein the organic gate insulating pattern comprises at least one of poly vinyl pyrrolidone, polymethylmethacrylate, benzocyclobutene, polyimide, polyvinylphenol, and parylene.

9. The organic thin film transistor substrate of claim 1, wherein an upper surface of the gate electrode is hydrophilic.

10. The organic thin film transistor substrate of claim 2, further comprising:
    a second bank-insulating layer on the source and drain electrodes; and
    an organic protective layer directly on the organic semiconductor pattern, the organic protective layer penetrating the second bank-insulating layer.

11. The organic thin film transistor substrate of claim 10, wherein a width of the second bank-insulating layer is larger than a width of the second conductive layer.

12. The organic thin film transistor substrate of claim 5, wherein a width of the organic gate insulating pattern is smaller than a width of the gate electrode.

* * * * *